Figure 1:
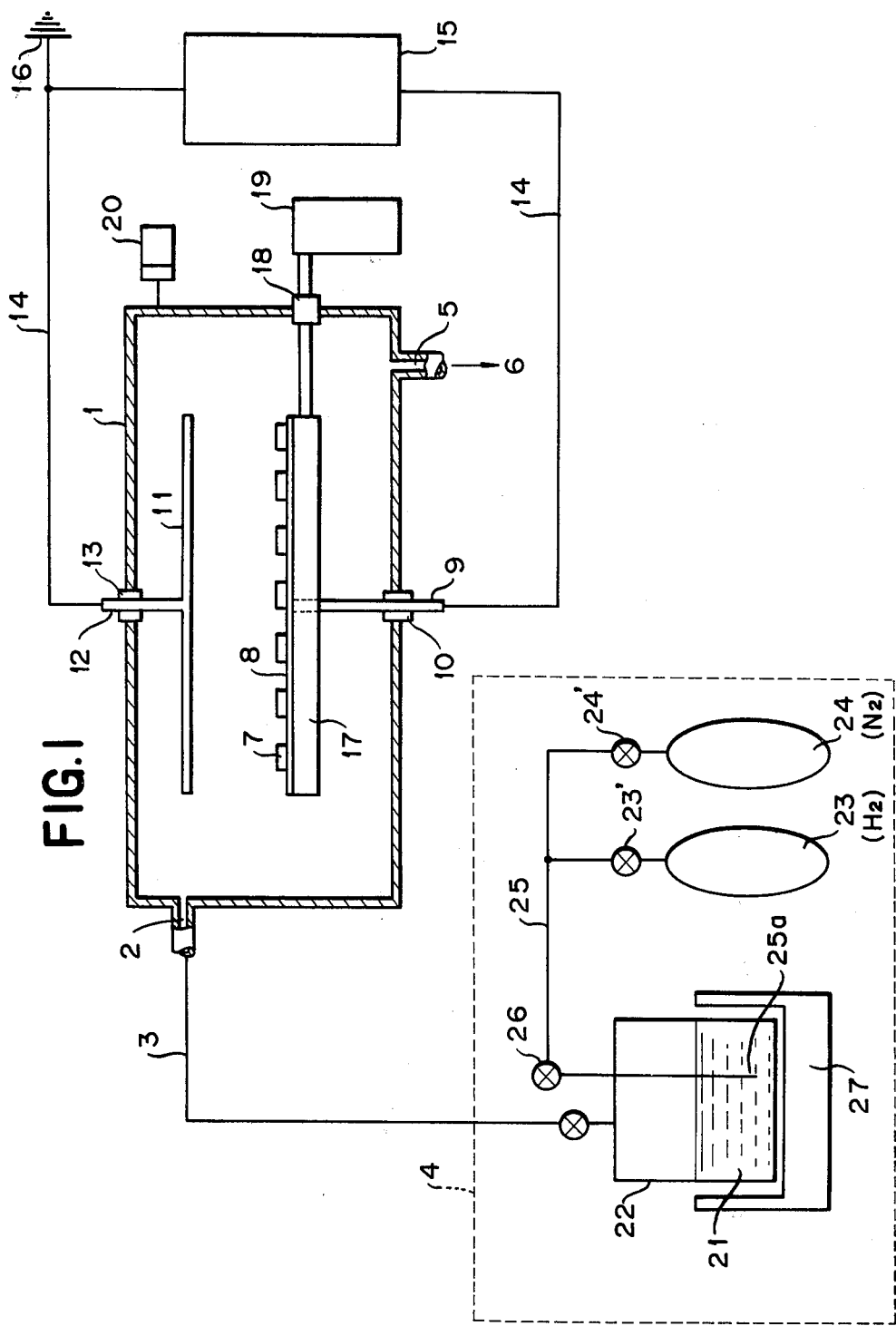

United States Patent [19]

Hirose et al.

[11] 4,420,498

[45] Dec. 13, 1983

[54] METHOD OF FORMING A DECORATIVE METALLIC NITRIDE COATING

[75] Inventors: Masahiko Hirose; Tsuyoshi Yasui; Yoshiharu Ochi; Masatoshi Nakagawa, all of Yokohama, Japan

[73] Assignee: Tokyo Shibaura Denki Kabushiki Kaisha, Kawasaki, Japan

[21] Appl. No.: 390,904

[22] Filed: Jun. 22, 1982

[30] Foreign Application Priority Data

Jun. 26, 1981 [JP] Japan .................................. 56-98353

[51] Int. Cl.$^3$ ............................................. C23C 13/04
[52] U.S. Cl. ................................. 427/39; 204/192 N; 204/177
[58] Field of Search ........................... 427/37, 38, 39; 204/164, 192 N, 177

[56] References Cited

U.S. PATENT DOCUMENTS

| 3,437,511 | 4/1969 | Hough | 117/69 |
| 4,197,175 | 4/1980 | Moll et al. | 427/38 |
| 4,212,687 | 7/1980 | Tanaka et al. | 204/177 |
| 4,226,082 | 10/1980 | Nishida | 427/38 |
| 4,254,159 | 3/1981 | Pulker et al. | 427/38 |
| 4,269,899 | 5/1981 | Fuyama et al. | 428/457 |
| 4,333,962 | 6/1982 | Pulker et al. | 427/37 |
| 4,346,123 | 8/1982 | Kaufmann | 427/38 |

FOREIGN PATENT DOCUMENTS

| 863997 | 2/1953 | Fed. Rep. of Germany | |
| 2825513 | 12/1978 | Fed. Rep. of Germany | 427/38 |
| 2842393 | 6/1979 | Fed. Rep. of Germany | 427/38 |
| 55-2715 | 1/1980 | Japan | |
| 57-76181 | 5/1982 | Japan | 427/38 |

OTHER PUBLICATIONS

Patents Abstracts of Japan, vol. 4, No. 26, p. 115 C1, Mar. 6, 1980.
Patents Abstracts of Japan, vol. 4, No. 73, p. 74 C12, May 28, 1980.
Patents Abstracts of Japan, vol. 4, No. 85, p. 123 C15, Jun. 18, 1980.
Suri, AK, "Synthesis of Titanium Nitrides by Activated Reactive Evaporation," Thin Solid Films, 72 (1980), pp. 529-533.
Proceedings of Conference on Ion Plating and Applied Techniques, IPAT 77 (1977), p. 243.

Primary Examiner—John H. Newsome
Attorney, Agent, or Firm—Schwartz, Jeffery, Schwaab, Mack, Blumenthal & Koch

[57] ABSTRACT

There is disclosed a method for forming a decorative metallic nitride coating on the surface of a substrate comprising the steps of disposing said substrate to be coated as a cathode in a material gas atmosphere at a pressure of 0.1 to 10 Torr, with said substrate maintained at a temperature of 200° to 1000° C., and applying a voltage of 200 to 8000 V to said substrate to prepare a direct current glow discharge space in the vicinity of said substrate, the improvement which comprises using as said material gas a mixed gas of a halide of titanium, zirconium or hafnium; hydrogen; and nitrogen, and controlling the current density of the electric current flowing through said substrate to be within the range of 0.01 to 1 mA/cm$^2$.

The method according to the present invention provides a uniform and beautiful metallic nitride coating which has a metallic luster stable with time, is excellent in mar resistance, and is suitable for decoration. Further, according to the method of this invention, a decorative metallic nitride coating capable of varying a tone on a metallic luster surface over a wide range can be formed.

7 Claims, 1 Drawing Figure

METHOD OF FORMING A DECORATIVE METALLIC NITRIDE COATING

The present invention relates to a method for forming a decorative metallic nitride coating, specifically to a method for forming a uniform and beautiful decorative metallic nitride coating having a golden luster stable with time and additionally having an excellent mar resistance. Further, the present invention relates to a method for forming a decorative metallic nitride coating capable of varying the tone on a golden luster surface over a wide range.

Heretofore, it has been attempted to form a decorative gold-colored coating of titanium nitride (TiN) on the surface of the body and the band of a wristwatch by use of a CVD method. As is definite from the fact, it has been known that such a TiN coating is suitable for decoration because of exhibiting a metallic luster when ground and having the so-called golden color in tone. However, a TiN coating formed by the CVD method has a coarse and rough surface. Therefore, unless ground as mentioned above, the TiN coating is improper to use as a decoration, and what is worse, a metallic nitride such as TiN is generally too hard to grind and so the grinding work is very heavy. In addition thereto, since the CVD method requires a treatment at a temperature as high as 900° to 1400° C., energy loss is rather great and a material as well as a shape of a substrate to be coated is disadvantageously limited, and a concentration gradient occurs from a gas inlet side toward a gas outlet side, thus finished products unsuitably tends to vary in their quality. Further, the necessary grinding of a coating and the great energy loss lead to the additional disadvantage that production cost is raised.

Also, an ion plating method has been attempted to form a decorative metallic nitride coating, but a coating obtained thereby is poor in uniformity, and such a method is unsuitable for mass treatment and thus manufacture on an industrial scale.

Further, there has been proposed a method for forming a wear-resistance metallic nitride coating on the surface of a substrate to be treated by reacting a gas comprising a metallic compound of an element in IVa group, hydrogen and nitrogen on the surface of the substrate disposed as a cathode with the aid of a direct current glow discharge treatment (Japanese Provisional Patent Publication No. 2715/1980). In this method, ions of a reaction gas are accelerated by a steep potential gradient in the vicinity of a substrate to be treated (cathode) to bring about a chemical reaction on the surface of the substrate, and the resultant metallic nitride is deposited on the substrate. Secondary electrons flown out by an ion bombardment collide repeated by with molecules of the reaction gas to ionize the gaseous molecules. In this case, the amount of the ions increase and accordingly the reaction is effectively continued. In other words, in the case of the above-mentioned direct current glow discharge method, the progress in the reaction is not accomplished by thermal energy as in a CVD method, therefore a lower temperature than in a CVD method, i.e. a temperature of about 200° to 1000° C. suffices for the reaction, which indicates that energy efficiency is good. Moreover, the glow discharge treatment also can provide a metallic nitride coating excellent in uniformity and is suitable for mass treatment.

However, the method of utilizing the above direct current glow discharge has been insufficient to form a decorative coating, because it has been developed aiming at the formation of a wear-resistant coating. It is important that a decorative coating has a luster and a tone which are uniform and stable with time, but the above-mentioned method sometimes cannot provide any luster, even if it provides some luster, such a luster is non-uniform. Further, in the case of a coating prepared according to the direct current glow discharge method, a tone is variable with time and some fogs often occur. Therefore, a coating obtained by the above method is quite useless as a decoration.

An object of the present invention is to provide a method for forming a uniform and beautiful metallic nitride coating which has a metallic luster stable with time, is excellent in mar resistance, and is suitable for decoration, and this method has been achieved by improving a method of utilizing a direct current glow discharge taking its advantages into consideration.

Another object of the present invention is to provide a method for forming a decorative metallic nitride coating capable of varying a tone on a metallic luster surface over a wide range.

According to the present invention, there is provided a method for forming a decorative metallic nitride coating on the surface of a substrate comprising the steps of disposing said substrate to be coated as a cathode in a material gas atmosphere at a pressure of 0.1 to 10 Torr, with said substrate maintained at a temperature of 200° to 1000° C., and applying a voltage of 200 to 8000 V to said substrate to prepare a direct current glow discharge space in the vicinity of said substrate, the improvement which comprises using as said material gas a mixed gas of a halide of titanium, zirconium or hafnium; hydrogen; and nitrogen, and controlling a current density of the electric current flowing through said substrate to be within the range of 0.01 to 1 mA/cm$^2$, preferably 0.05 to 0.65 mA/cm$^2$.

As halides of titanium, zirconium and hafnium which are components of the material gas, titanium tetrachloride, zirconium tetrachloride and hafnium tetrachloride are preferred.

In the present invention, it is especially important that a current density of the electric current flowing through a substrate is controlled to 0.01 to 1 mA/cm$^2$, preferably 0.05 to 0.65 mA/cm$^2$. When a current density is less than 0.01 mA/cm$^2$, the rate of coating formation is very slow and is not practical, and the adhesion between the formed coating and a substrate is poor. On the contrary, when a current density is more than 1 mA/cm$^2$, the non-uniformity of the coating occurs on edge portions or corner portions of a substrate, and thus it is impossible to obtain a uniform luster surface under such conditions. Further, when such conditions are taken due to the influence of sputtering by ions, heavy roughness and fogs occur on the surface of a substrate.

In regard to a composition of the material gas used in the present invention, a molar ratio of a metallic halide:hydrogen:nitrogen is preferably 1:12 to 100:1 to 100, more preferably 1:12 to 50:1 to 30. When a molar ratio of hydrogen is less than 12 with respect to a metallic halide, some spots appear on an obtained coating and color changes are liable to occur thereon. This would be attributed to adverse effect of a remaining halogen such as chloride which has been produced by a reaction. Further, when a molar ratio of nitrogen is less than 1, no nitride coating is formed. When a molar ratio of hydrogen and/or nitrogen is more than 100, the formation rate of a nitride coating is low, which fact makes its practicability low, and such conditions tend to prepare a rough coating.

As a general trend, the more a molar ratio of nitrogen with respect to hydrogen, the deeper dark golden color a tone on a coating becomes, and the less this molar ratio, the paler light golden color a tone thereon becomes. Therefore, the adjustment of a material gas composition permits the tone on a coating to vary over a wide range. In view of the tendency that among golden colors a light color is likable for decoration, though there are some individual differences of taste, it has been found that a material gas constituently having a molar ratio of a metallic halide:hydrogen:nitrogen being 1:20 to 30:2 to 3 is most suitable.

Hydrogen used as one component of a material gas has significant functions of reducing a metallic halide and removing a halogen component such as chloride in the form of a hydrogen halide so as not to leave any halogen on the surface of a substrate. Existence of a halogen such as chlorine causes the formation of an unstable tone, a color change and the occurrence of fogs, as mentioned above. For the purpose of preventing such a color change and occurrence of fogs, it is preferred that a used substrate is subjected to a glow discharge post-treatment with a hydrogen gas alone. This post-treatment serves to get rid of a remaining halogen in the form of a hydrogen halide, when a halogen is left on a metallic nitride coating.

The glow discharge post-treatment with a hydrogen gas alone ordinarily is carried out under a pressure of 0.1 to 10 Torr at a temperature of 100° to 800° C. at a voltage of 200 V to 2 KV. The current density are usually in the range of 0.15 to 10 mA/cm$^2$, preferably of 0.2 to 2 mA/cm$^2$.

According to the method of the present invention, a beautiful metallic nitride coating can be formed on an article made of any electrically conductive material such as a metal, a semiconductor or a conductive ceramic. The thickness of a coating to be formed is within the range of 1 to 3 μm, which is enough in practice.

The FIGURE shows illustratively an apparatus for carrying out the method according to the present invention. The present invention will be explained in more detail by way of these drawings.

The coating apparatus exhibited in the drawing is composed of a reaction vessel 1, a gas feeding system 4 for feeding a material gas to a gas feeding inlet 2 of the reaction vessel 1 via a pipe 3, and an exhaust system 6 (not shown) connected to an exhaust outlet 5 of the reaction vessel 1. Inside the reaction vessel 1, there is horizontally supported a plate cathode 8 on which substrates 7 to be treated are mounted in an electrically conducting state, and an end portion 9 of the cathode 8 is led out of the reaction vessel 1 via an insulating vacuum seal 10. Further, above the cathode 8, a corresponding electrode (anode) 11 is supported with the interposition of a suitable space (in this embodiment, 10 cm) and an end portion 12 of the anode 11 is also led out of the reaction vessel 1 via an insulating vacuum seal 13.

The respective electrodes are connected to suitable terminals of a direct current electric source 15 by wires 14, and the anode side thereof may be suitably earthed at the ground 16. The plate cathode 8 is provided with a heater 17 on the underside, and the heater 17 is connected to an electric source 19 for the heater via an insulating vacuum seal 18. By means of the behavior of the heater, the substrates mounted on the cathode 8 can be heated to a desired temperature. Further, the reaction vessel 1 is provided with a diaphragm pressure gauge 20 so that a pressure in the vessel may be measured. Furthermore, the reaction vessel 1 is provided with a glass window (not shown), so that a temperature of the substrates 7 to be coated can be caught with a pyroscope (infrared radiation thermometer) and a discharge state can be observed therethrough.

The material gas feeding system 4 includes a sealed container 22 therein for receiving a metallic halide 21, and hydrogen and nitrogen are supplied from a hydrogen bomb 23 and a nitrogen bomb 24, respectively, through valves 23' and 24' by which a flow rate of each component is adjusted. These gases are further forwarded through a pipe 25, and at this time they are mixed. The resultant $H_2$—$N_2$ mixed gas is finally led to the sealed container 22 via a valve 26. A tip 25a of the pipe 25 extends under a liquid level of the metallic halide 21. The sealed container 22 is provided with a temperature controller 27 therearound in order to automatically control a temperature in the sealed container 22 to a desired constant level and to thus obtain a desired vapor pressure of a metallic halide. In other words, a composition of a material gas to be fed to the reaction vessel 1 can be adjusted by regulating the valves 23' and 24' as well as the temperature controller 27.

The present invention will be explained as examples using the above-mentioned apparatus, as follows:

EXAMPLE 1

As specimens to be coated, there were used metallic plates comprising an alloy composed of 38% of Cr, 3.8% of Al and the remainder of Ni and having a size of 30×30×5 mm. Enough degreased and washed specimens were set on the plate cathode 8 in the reaction vessel 1. Titanium tetrachloride was used as a metal source. The interior of the reaction vessel 1 was first exhausted to $10^{-5}$ Torr or less by use of a vacuum pump and a material gas was then fed thereto, and a direct current voltage was applied between the electrodes to cause a glow discharge, so that a titanium nitride coating was formed on the surface of each specimen. Each group of 100 specimens was coated under conditions shown in Table 1, and thus formed coatings were evaluated for their characteristics, especially uniformity of luster. Results obtained are also exhibited in Table 1.

TABLE 1

| | Treating conditions | | | | | | Result | | | |
|---|---|---|---|---|---|---|---|---|---|---|
| Specimen | Gas composition $TiCl_4$:$H_2$:$N_2$ (Molar ratio) | Pressure (Torr) | Voltage (volt) | Current density (mA/cm$^2$) | Specimen temperature (°C.) | Treating time (min.) | Coating thickness (μm) | Luster uniformity | Tone | Remarks |
| 1 | 1:19:6 | 2 | 500 | 0.1 | 550 | 30 | 2 | Good | Golden | |
| 2 | 1:23:3 | 2 | 500 | 0.05 | 600 | 30 | 2 | Good | Light | |

TABLE 1-continued

| | Treating conditions | | | | | | Result | | | |
|---|---|---|---|---|---|---|---|---|---|---|
| Specimen | Gas composition TiCl$_4$:H$_2$:N$_2$ (Molar ratio) | Pressure (Torr) | Voltage (volt) | Current density (mA/cm$^2$) | Specimen temperature (°C.) | Treating time (min.) | Coating thickness (μm) | Luster uniformity | Tone | Remarks |
| 3 | 1:99:33 | 1 | 600 | 0.05 | 600 | 60 | 3 | Good | golden Golden | |
| 4 | 1:61:61 | 1 | 500 | 0.3 | 500 | 60 | 3 | Good | Deep golden | |
| *5 | 1:80:20 | 3 | 2000 | 1.1 | 600 | 30 | 5 | Bad | Dark golden | Irregular and non-uniform |
| *6 | 1:23:3 | 2 | 350 | 0.008 | 550 | 60 | 0.1 | Bad | Bad | Thin and pale |
| 7 | 1:12:12 | 2 | 800 | 0.9 | 550 | 30 | 3 | Good | Deep golden | |

Specimens having the mark * were used for comparison.

EXAMPLE 2

The same metallic plates as in Example 1 were used as specimens, and each group of 100 specimens was coated changing variously a composition of a material gas as shown in Table 2 under the conditions of a voltage of 550 V, a current density of 0.15 mA/cm$^2$, a material gas pressure of 2 Torr and a specimen temperature of 570° C. For the tone evaluation of a coating formed on each specimen, the tone of the coating on Specimen No. 202 (TiCl$_4$:H$_2$:N$_2$=1:23.1:1.2, N$_2$/H$_2$=0.05) having a pale light golden color was taken to be tone value 1, the tone of the coating on Specimen No. 212 having a deep dark golden color was taken to be tone value 10, and the interval between tone values 1, and 10 was divided into 10 grades. Results obtained from the evaluation mentioned above are also shown in Table 2. The results indicate the tendency that as N$_2$/H$_2$ (molar ratio) of material gases is getting more, the golden color of coatings is getting deeper.

TABLE 2

| Specimen No. | Material gas composition (molar ratio) TiCl$_4$:H$_2$:N$_2$ | N$_2$/H$_2$ | Tone | Result Remarks |
|---|---|---|---|---|
| *201 | 1:90.3:0.9 | 0.01 | 0 | Scarcely colored |
| 202 | 1:23.1:1.2 | 0.05 | 1 | |
| 203 | 1:21.9:2.4 | 0.11 | 2 | |
| 204 | 1:83.2:4.3 | 0.05 | 3 | |
| 205 | 1:18.3:6.1 | 0.33 | 4 | |
| 206 | 1:78.8:8.6 | 0.11 | 5 | |
| 207 | 1:12.2:12.2 | 1.0 | 6 | |
| *208 | 1:6.1:18.3 | 3.0 | 7 | Colored but changeable with time |
| 209 | 1:65.9:21.9 | 0.33 | 8 | |
| *210 | 1:2.4:21.9 | 9.0 | 8 | Colored but changeable with time |
| 211 | 1:21.9:65.9 | 3.0 | 9 | |
| *212 | 1:8.6:78.8 | 9.0 | 10 | Colored but changeable with time |

Specimens having the mark * were used for comparison.

EXAMPLE 3

As specimens to be coated, there were used metallic plates comprising an alloy composed of 38% of Cr, 3.8% of Al and the remainder of Ni and having a size of 30×30×5 mm. Sufficiently degreased and washed specimens (100 pieces) were set on the plate cathode 8 in the reaction vessel 1. Titanium tetrachloride was used as a metal source. The interior of the reaction vessel 1 was first exhausted to 10$^{-5}$ Torr or less by using a vacuum pump and a material gas was then introduced thereinto. The composition of the material gas had a molar ratio of TiCl$_4$:H$_2$:N$_2$=1:19:6. Discharge was carried out under the conditions as follows: pressure: 2 Torr, voltage: 500 V, current density: 0.1 mA/cm$^2$, treating temperature: 550° C., time: 30 minutes. After cooling, the specimens were taken out from the reaction vessel.

Another 100 pieces of the same specimens were subjected to coating treatment in the same manner as in the above, and then the remaining gas in the reaction vessel was exhausted, followed by introduction of a hydrogen gas alone to carry out a glow discharge post-treatment. The post treatment was conducted under a pressure of 2 Torr at a voltage of 600 V at a current density of 0.5 mA/cm$^2$ for 30 minutes. Thereafter, the specimens were taken out from the reaction vessel.

Among the formed 100 pieces of the treated specimens, 35 pieces were observed to be changed with time with respect to their surface state, and clouds and spots were caused on the surfaces. In contrast thereto, with respect to the latter post-treated specimens, there was caused no failure and a gold colored coating having a beautiful luster was observed to have been formed, and no change with time was observed.

We claim:

1. A method for forming a decorative metallic nitride coating on the surface of a substrate comprising the steps of disposing said substrate to be coated as a cathode in a material gas atmosphere at a pressure of 0.1 to 10 Torr, with said substrate maintained at a temperature of 200° to 1000° C., and applying a voltage of 200 to 8000 V to said substrate to prepare a direct current glow discharge space in the vicinity of said substrate, the improvement which comprises using as said material gas a mixed gas of a halide of titanium, zirconium or hafnium; hydrogen; and nitrogen, and controlling the current density of the electric current flowing through said substrate to be within the range of 0.01 to 1 mA/cm$^2$.

2. A method according to claim 1, wherein the current density of the electric current flowing through said substrate is within the range of 0.05 to 0.65 mA/cm$^2$.

3. A method according to claim 1, wherein the composition of said material gas has a molar ratio of a metallic halide:hydrogen:nitrogen being 1:12 to 100:1 to 100.

4. A method according to claim 3, wherein the composition of said material gas has a molar ratio of a metallic halide:hydrogen:nitrogen being 1:12 to 50:1 to 30.

5. A method according to claim 1 wherein the halide is selected from the group consisting of titanium tetrachloride, zirconium tetrachloride and hafnium tetrachloride.

6. A method according to claim 1 which further comprises a step of carrying out a glow discharge post-treatment with a hydrogen gas alone.

7. A method according to claim 6 wherein the glow discharge post-treatment is carried out under the following conditions:
pressure: 0.1 to 10 Torr
temperature: 100° to 800° C.
voltage: 200 V to 2 KV
current density: 0.15 to 10 mA/cm$^2$.

* * * * *